United States Patent
Hiraki

[11] Patent Number: 5,306,569
[45] Date of Patent: Apr. 26, 1994

[54] TITANIUM-TUNGSTEN TARGET MATERIAL AND MANUFACTURING METHOD THEREOF

[75] Inventor: Akitoshi Hiraki, Yasugi, Japan

[73] Assignee: Hitachi Metals, Ltd., Tokyo, Japan

[21] Appl. No.: 914,544

[22] Filed: Jul. 16, 1992

Related U.S. Application Data

[63] Continuation-in-part of Ser. No. 708,340, May 31, 1991, Pat. No. 5,160,534.

[30] Foreign Application Priority Data

Jun. 15, 1990 [JP] Japan ................... 2-157287
Feb. 12, 1991 [JP] Japan ................... 3-040999
Mar. 20, 1991 [JP] Japan ................... 3-081643

[51] Int. Cl.$^5$ .................................... B22F 3/16
[52] U.S. Cl. .................... 428/569; 420/430; 419/31; 419/33; 419/46; 419/47; 419/49; 419/52
[58] Field of Search ............ 29/182.8; 75/65 EB, 75/150, 214, 230, 238, 248; 156/664; 204/15, 192.32; 357/71; 361/321; 419/8; 428/664

[56] References Cited

U.S. PATENT DOCUMENTS

| | | | |
|---|---|---|---|
| 4,331,476 | 5/1982 | Helderman | 75/214 |
| 4,782,380 | 11/1988 | Shankar et al. | 357/71 |
| 4,838,935 | 6/1989 | Dunlop et al. | 75/230 |
| 4,862,318 | 8/1989 | Galvagni et al. | 361/321 |
| 4,938,798 | 7/1990 | Chiba et al. | 75/230 |
| 5,160,534 | 11/1992 | Hiraki | 75/248 |

FOREIGN PATENT DOCUMENTS 63-303017 12/1988 Japan .

OTHER PUBLICATIONS

Jenkins et al. (Eds.) "Powder Metallurgy; An Overview", 1991, 22-29, The Institute of Metals (London).
International Journal of Refractory Metals and Hard Materials vol. 9, No. 3, Sep. 1990, Amsterdam, NL pp. 146-153, M. Yamauchi et al. 'Development of W-Ti Binary Alloy Sputtering Target and Study of Its Sputtering Characteristics' p. 148, right-hand column "Microstructure of W-Ti Binary Alloy".
Patent Abstracts of Japan, vol. 13, No. 137 (C-582) Apr. 5, 1989 & JP-A-63 303 017 (Nippon Mining Co. Ltd.) Dec. 9, 1988.
Patent Abstracts of Japan, vol. 16, No. 71 (C-913) Feb. 21, 1992 & JP-A-32 64 640 (Hitachi Metals Ltd.) Nov. 25, 1991.

Primary Examiner—Donald P. Walsh
Assistant Examiner—J. N. Greaves
Attorney, Agent, or Firm—Sughrue, Mion, Zinn, Macpeak & Seas

[57] ABSTRACT

A titanium-tungsten target material capable of limiting the amount of particles generated during sputtering and a method of manufacturing this titanium-tungsten material. The titanium-tungsten target material has a titanium-tungsten alloy phase which occupies 98% or more of the whole area of the material as observed in a microstructure thereof. In one example of the manufacturing method, an ingot obtained by melting tungsten and titanium is processde by a solution treatment to form a titanium-tungsten target, or a power obtained by melting the ingot is sintered to form a target. Preferably, the melting may be performed under reduced pressure in an electron beam melting manner. In another example of the manufacturing method, a powder is formed from a molten metal by an atomization method and the obtained powder is sintered to form a titanium-tungsten target. For sintering of the powder, it is preferable to apply hot isostatic pressing or hot pressing.

9 Claims, 1 Drawing Sheet (60C x)

F I G. 1
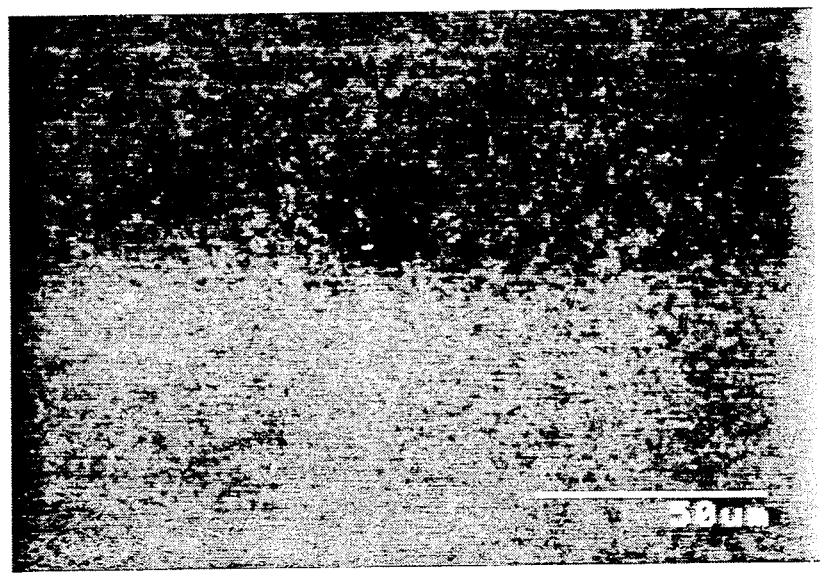
(600x)
F I G. 2
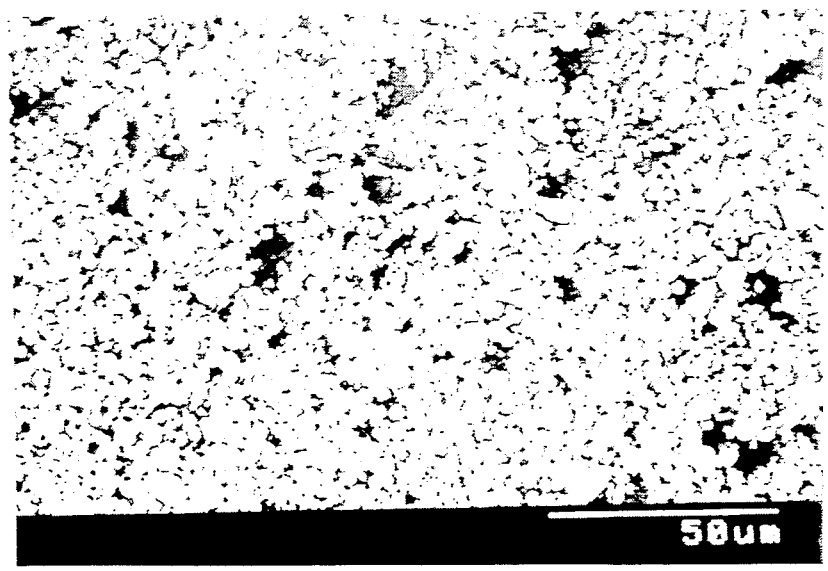
(600x)

TITANIUM-TUNGSTEN TARGET MATERIAL AND MANUFACTURING METHOD THEREOF

CROSS REFERENCE TO RELATED APPLICATION

This is a continuation in part of U.S. Pat. application Ser. No. 07/708340 filed on May 31, 1991, now U.S. Pat. No. 5,160,534.

BACKGROUND OF THE INVENTION

This invention relates to a titanium-tungsten (titanium-tungsten) target material used to form a barrier metal layer or the like for use in semiconductor devices and to a method of manufacturing the titanium-tungsten target material.

With the increase in the degree of integration of large scale integrated circuits (LSIs), a problem of aluminum wiring migration, such as contact migration of diffusion precipitates at contact portions of aluminum wiring and a silicon semiconductor substrate, has arisen. To cope with this problem, barrier metal layers have recently been studied.

A titanium-tungsten thin film (typically composed of 10 wt %. of titanium and the balance of tungsten) is often used as a barrier metal layer, and a method of sputtering a target is adopted to form such a titanium-tungsten thin film.

In general, a titanium-tungsten target material for the thin film is manufactured by blending a titanium powder and a tungsten powder and hot-pressing the blended powder.

However, titanium powders used as raw materials for the conventional titanium-tungsten targets have a large oxygen content, and the oxygen content of targets formed from such raw materials is necessarily high.

Such high-oxygen-content targets are disadvantageous because oxygen is liberated during sputtering to cause cracks in the target, oxidation of formed films, and variations in film quality.

U.S. Pat. No. 4,838,935 discloses a method for reducing the oxygen content of a titanium-tungsten target or a fact that the formation of a high-density low-porosity target as well as reductions in the carbon and oxygen contents can be achieved by replacing at least a pair of a titanium powder with hydrogenated titanium or by using a tungsten powder having a binodal grain size distribution and a hydrogenated titanium powder or a mixture of a hydrogenated titanium powder and a titanium powder.

JP-A-63-303017 also discloses a method for reducing the oxygen content of a titanium-tungsten target. In this method, a tungsten powder and a hydrogenated titanium powder are blended together and hot-pressed after or while being dehydrogenated.

The use itself of the hydrogenated titanium powder is effective in preventing oxidation and is also capable of limiting the amount of oxygen picked up during milling because the hydrogenated titanium powder may be more suitably milled with less contamination by oxygen as compared with the ordinary titanium powder.

It has thus become possible to obtain titanium-tungsten targets having an oxygen concentration as low as 900 pm or less.

As has been described, research has been made extensively to reduce the oxygen content of titanium-tungsten target materials.

The above-mentioned publications, however, contain no suggestion as to how the structure of titanium and tungsten constituting a target affects sputtering, that is, they do not disclose at all that the alloy structure, particularly the presence of a titanium phase, relates to the occurrence of particles during sputtering.

Recently, with the development of semiconductor products having thinner conductors formed at a higher density, a new problem has arisen with respect to a sputtering process using the above-mentioned low-oxygen-concentration titanium-tungsten target in that large particles attach to a thin film formed by sputtering to cause disconnection of electrode wiring conductors.

The generation of such particles cannot be prevented as long as only the method for reducing the titanium-tungsten target oxygen content is used.

To solve this problem, the inventor of the present invention has examined in detail the relationship between the target structure and the generation of particles, and has found that coarse titanium grains relate to the generation of the particles. That is, the inventor has ascertained, as one of the reasons for the generation of particles, a fact that in the presence of both titanium and tungsten, titanium having a light atomic weight is selectively sputtering, and that tungsten grains contained in or in the vicinity of coarse titanium particles are scattered as large particles from the target material.

SUMMARY OF THE INVENTION

Thus, it is an object of the present invention to provide a titanium-tungsten target material whose structure is controlled so that the amount of generated particles is very small and a method of manufacturing the titanium-tungsten target material.

The inventor of the present invention has found that the formation of a titanium-tungsten alloy phase in effective in obtaining a titanium-tungsten target material free from scattering of tungsten particles due to the difference between the sputtering speeds of titanium and tungsten.

The present invention provides a titanium-tungsten target material in which a titanium-tungsten alloy phase occupies 98% or more of a cross-sectional area of the titanium-tungsten target material.

The titanium-tungsten target material in accordance with the present invention is substantially composed of a titanium-tungsten alloy phase alone, and the titanium-tungsten alloy may have any composition. Containing a small amount of fine α-Ti precipitated during cooling causes no serious problem, but it is necessary that the titanium-tungsten alloy phase occupies 98% or more of a cross sectional area of the titanium-tungsten target material.

This condition of the structure in accordance with the present invention is expressed as "the material is substantially composed of a titanium-tungsten alloy phase alone".

Although the target material in accordance with the present invention may contain a small amount of α-Ti less than 2% in area), it is substantially composed of a titanium-tungsten alloy phase alone and does not contain liberated tungsten and titanium phases such as those contained in the conventional titanium-tungsten target material. It is thereby possible to prevent the generation of particles on the formed film due to the difference between the sputtering speeds of tungsten and titanium.

According to the present invention, in one aspect, there is provided a titanium-tungsten target manufacturing method characterized in that an ingot obtained by melting tungsten and titanium is processed by a solution treatment to form a titanium-tungsten target. The material may be formed into the shape of the target by cutting the ingot.

According to the present invention, in another aspect, there is provided a titanium-tungsten target manufacturing method characterized in that an ingot obtained by melting tungsten and titanium is milled into a powder which is sintered to form a titanium-tungsten target.

According to the present invention, in still another aspect, there is provided a titanium-tungsten target manufacturing method characterized in that a powder is formed from a molten metal based on an atomization method and the obtained powder is sintered to form a titanium-tungsten target.

By the solution treatment of an ingot obtained by melting tungsten and titanium in accordance with the present invention, the resulting material has a structure in which the amount of segregation is small and which is substantially composed of a titanium-tungsten alloy phase alone. Even if α-Ti is precipitated during cooling for, e.g., the solution treatment, the precipitated α-Ti is less than 2% in terms of microstructure press proportion.

Preferably, the solution treatment in accordance with the present invention is effected at a temperature of 1250° to 1650° C.

Titanium and tungsten can form a complete solid solution. However, they cannot be formed in a desired solid solution state at a temperature of lower than 1250° C. and may be partially melted at a temperature of higher than 1650° C. Therefore, the treatment at temperatures out of the range of 1250° to 1650° C. is not preferable. It is preferable to perform this solution treatment in an atmosphere of a reduced pressure or in an inert gas in terms of prevention of mixing of impurities.

In accordance with the present invention, it is possible to limit the segregation in the target structure by the process of milling an ingot and sintering the powder thereby obtained, so that the extent of generation of particles can be further reduced.

For the milling, a well known method using a ball mill, a high energy ball mill (Attoritor Union Process Co.) or the like can be used.

In accordance with the present invention, it is preferable to melt raw materials in an atmosphere of a reduced pressure by electron beam melting in terms of prevention of mixing of impurities such as oxygen and other substances.

An atomization method may be used advantageously in accordance with the present invention, because the melt in a liquid state is formed into a powder by rapid cooling so that the extent of segregation in each powder is very small, and because the oxygen content of the resulting material can be reduced since there is no need for a solution treatment and there is no milling step.

In accordance with the present invention, well known methods, such as a gas-atomizing method, a wateratomizing method and a rotating electrode method, can be used.

In accordance with the present invention, sintering is performed with a hot isostatic press (hereinafter referred to as "HIP") or a hot press to obtain a high-density target which is preferable in terms of mechanical strength.

BRIEF DESCRIPTION OF THE DRAWINGS

FIG. 1 is a photograph of the alloy structure of an example of the target material in accordance with the present invention (magnified 600 times); and FIG. 2 is a photograph of the alloy structure of a target material provided as a reference example (magnified 600 times).

DESCRIPTION OF THE PREFERRED EMBODIMENTS

Examples

Example 1

A high-purity tungsten powder (having a 9.999% or higher purity and a 5 μm or less average grain size) and high-purity titanium (having 99.99% or higher purity and a 150 μm or less average grain size) were blended together by a blender with a tungsten lining at a ratio such as to set a titanium content of 10 wt %. The mixture powder obtained was formed with a cold isostatic press (CIP) under a condition of 2000 kg/cm$^2$, thereby preparing a raw material for melting.

The raw material was melted by an electron beam melting process to form a high-purity ingot. The obtained ingot was processed by solution treatment in a vacuum furnace (in an atmosphere having a degree of vacuum lower than $5 \times 10^{-5}$ torr) at 1400° C. for 10 hours to form a target material. The oxygen content of the obtained target material was 120 ppm.

The metal structure of the obtained target material was observed by being magnified 600 times with a scanning electronic microscope. FIG. 1 shows a photograph of the metal structure thereby obtained.

As shown in FIG. 1, no substantially large amount of segregation was observed and substantially no independent phase of titanium and tungsten was observed except for a titanium-tungsten alloy phase.

The obtained target material was machined into a titanium-tungsten target plate having a diameter of 300 mm, and the target was used in a sputtering process to deposit the material on a six inch wafer. The number of generated particles of 0.3 μm or greater observed thereon was very small, 22.

Example 2

A raw material for melting obtained under the same conditions as Example 1 was melted by an electron beam melting process to obtain a high-purity ingot. The obtained ingot was processed by solution treatment in a vacuum furnace (in an atmosphere having a degree of vacuum lower than $5 \times 10^{-5}$ torr) at 1400° C. for 10 hours and was milled with a tungsten boat and a tungsten rod. Thereafter, the milled material was put in a special ball mill having a pot with a tungsten lining and tungsten balls, and the interior of the pot was evacuated to substitute an Ar gas to provide a non-oxidizing atmosphere. In this atmosphere, the material was mixed while being milled, thereby obtaining a powder having a grain size of 150 μm or smaller.

The obtained powder was packed in a HIP-can having an inside diameter of 400 mm and was heated at 400° C. for five hours while evacuating the can at $5 \times 10^{-5}$ torr. The can was sealed after removing a surface adsorbed gas or the like. and a HIP treatment was then performed at 1200° C. and 1000 kg/cm$^2$ for two hours, thereby forming a target material. The oxygen content of this target material was 590 ppm.

The metal structure of the obtained target material was a structure having a titanium-tungsten alloy phase alone, as in the case of Example 1.

This target material was machined into a target having a diameter of 300 mm, and this target was used in a sputtering process to deposit the material on a six inch wafer. The number of generated particles of 0 3 μm or greater observed thereon was very small, eight.

Example 3

A raw material for melting was prepared in the same manner as Example 1. This melt raw material was melted and ejected by a gas-atomizing apparatus to obtain an atomized powder.

The obtained atomized powder was classified into a powder of 100 mesh of finer which was packed in a HIP-can having an inside diameter of 400 mm and was heated at 400° C. for five hours while evacuating the can at $5 \times 10^{-5}$ torr. The can was sealed after removing a surface adsorbed gas or the like, and a HIP treatment was then performed at 1200° C. and 1000 kg/cm² for two hours, thereby forming a target material. The oxygen content of the target material was 380 ppm.

The metal structure of the obtained target material was a structure having a titanium-tungsten alloy phase alone, as in the case of Example 1.

The target material was machined into a target plate having a diameter of 300 mm, and the target plate was used in a sputtering process to deposit the material on a six inch wafer. The number of generated particles of 0.3 μm or greater observed thereon was very small, seven.

Example 4

A raw material for melting obtained under the same conditions as Example 1 was melted by an electron beam melting process to form a high-purity ingot. The obtained ingot was processed by solution treatment in a vacuum furnace (in an atmosphere having a degree of vacuum lower than $5 \times 10^{-5}$ torr) at 1400° C. for 10 hours and was milled with a tungsten boat and a tungsten rod. Thereafter, the milled material was put in a special ball mill having a pot with a tungsten lining the tungsten balls, and the interior of the pot was evacuated to substitute an Ar gas to provide a non-oxidizing atmosphere. In the atmosphere, the material was mixed while being milled, thereby obtaining a powder having a grain size of 150 μm or smaller.

The obtained powder was sintered or sintered and pressed into compacts by each of a vacuum sintering method, a hot-press method and a HIP method to be used as target materials.

Table 1 shows the sintering conditions of each sintering method, the density of the sintered materials, and the numbers of generated particles of 0.3 μm or greater on six inch wafers to which the target materials were deposited by sputtering, which particles were counted by structure observation.

TABLE 1

| Sintering method | Vacuum sintering | Hot pressing | HIP |
| --- | --- | --- | --- |
| Sintering conditions | 1450° C. × 5 hours. 5.0 × 10⁻⁵ torr | 300° C. × 1 hour. 300 kg/cm² | 1200° C. × 1 hour. 1000 kg/cm² |
| Relative density | 85% | >99.9% | >99.9% |
| Structure | titanium-tungsten | titanium-tungsten | titanium-tungsten |
| | alloy single phase | alloy single phase | alloy single phase |
| The number of particle | 74 | 11 | 8 |

It is understood from Table 1 that if the hot-press method of the HIP method is used, the target material has a higher density and the number of particles generated by sputtering can be reduced.

The reason for the phenomenon in which the number of particles was increased while the density was lower may be that an abnormal discharge occurred during sputtering due to blow holes or vacancy existing in the target.

Comparative Example 1

A high-purity tungsten powder (having a 99.999% or higher purity and a 5 μm or less average grain size) and hydrogenated high-purity titanium (having 99.99% or higher purity and a 75 μm or less average grain size, hereinafter referred to as hydrogenated titanium) were blended together so as to set a hydrogenated titanium content of 10.36 wt %. The mixture powder obtained was put in a special ball mill having a pot with a tungsten lining and tungsten balls, and the interior of the pot was evacuated to substitute an Ar gas to provide a non-oxidizing atmosphere. In this atmosphere, the material was mixed for 90 minutes while being milled.

In the powder thereby obtained, no hydrogenated titanium particles of 20 μm or greater were observed and the average grain size was 4 μm.

The obtained mixture powder was packed in a HIP-can having an inside diameter of 400 mm and was dehydrogenated by being heated at 700° C. for 24 hours while evacuating the can at $5 \times 10^{-5}$ torr. The can was sealed after the dehydrogenation, and a HIP treatment was then performed at 1250° C. and 1000 atm for 2 hours. FIG. 2 shows a photograph of the structure of the obtained sintered material magnified 600 times. In FIG. 2, white grains are tungsten grains, and gray portions existing between the tungsten grains correspond to a titanium phase. It is understood that although tungsten in the sintered material is dispersed in the form of fine particles, titanium is partially aggregated. At this stage, it was not possible to detect a titanium-tungsten alloy phase.

This sintered material was used as a target material and was machined into a target plate having a diameter of 300 mm. This target was used in a sputtering process to deposit the target material on a six inch wafer. The number of generated particles of 0.3 μm or greater observed thereon was 140, which is very large in comparison with the target material of the present invention.

Example 5

A sintered material obtained in the same manner as Reference Example 1 was used as a melt raw material. This raw melt material was melted by electron beam melting to form a high-purity ingot. The obtained ingot was processed by solution treatment in a vacuum furnace (in an atmosphere having a degree of vacuum lower than $5 \times 10^{-5}$ torr) at 1400° C. for 10 hours, thereby obtaining a target member.

It was confirmed that the obtained target material had a structure having a titanium-tungsten alloy phase alone, as in the case of Example 1.

The obtained target material was machined into a titanium-tungsten target having a diameter of 300 mm, and this target was used in a sputtering process to deposit the target material on a 6 inch wafer. The number of generated particles of 0.3 μm or greater observed thereon was very small, 16.

In the target material and the manufacturing method of the present invention, as is apparent from the above, a titanium-tungsten alloy phase can be formed alone, so that sputtering can be performed with a very small amount of generated particles. It is thereby possible to provide a target and a thin film which are very effective in improving the qualities of semiconductor devices.

What is claimed is:

1. A titanium-tungsten target material comprising a titanium-tungsten alloy phase which occupies 98% or more of a cross-sectional area of the titanium-tungsten target material.

2. A method of manufacturing a titanium-tungsten target, comprising the steps of preparing an ingot formed by melting tungsten and titanium; and processing the ingot by a solution treatment.

3. A method of manufacturing a titanium-tungsten target, comprising the steps of preparing an ingot formed by melting tungsten and titanium;

pulverizing the ingot into a powder; and sintering the powder.

4. A method of manufacturing a titanium-tungsten target according to claim 2 or 3, wherein tungsten and titanium are melted by an electron beam melting process under reduced pressure.

5. A method of manufacturing a titanium-tungsten target, comprising the steps of preparing a molten metal formed by melting tungsten and titanium;

forming a powder from the molten metal by an atomization method; and sintering the powder.

6. A method of manufacturing a titanium-tungsten target according to claim 3 or 5, wherein sintering is effected by hot isostatic pressing.

7. A method of manufacturing a titanium-tungsten target according to claim 3 or 5, wherein sintering is effected by hot pressing.

8. A titanium-tungsten target material according to claim 1, consisting essentially of a titanium-tungsten alloy phase.

9. A titanium-tungsten target material according to claim 1, not containing an independent tungsten or titanium phase.

* * * * *